United States Patent
Sakai

(10) Patent No.: US 10,741,546 B2
(45) Date of Patent: Aug. 11, 2020

(54) SEMICONDUCTOR DEVICE

(71) Applicant: FUJI ELECTRIC CO., LTD., Kanagawa (JP)

(72) Inventor: Yasuaki Sakai, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/392,655

(22) Filed: Apr. 24, 2019

(65) Prior Publication Data

US 2020/0006323 A1    Jan. 2, 2020

(30) Foreign Application Priority Data

Jun. 29, 2018  (JP) ................................ 2018-124847

(51) Int. Cl.
*H01L 27/06* (2006.01)
*H02M 3/158* (2006.01)

(52) U.S. Cl.
CPC ........ *H01L 27/0629* (2013.01); *H02M 3/158* (2013.01)

(58) Field of Classification Search
CPC .................................................. H01L 27/0629
See application file for complete search history.

(56) References Cited

U.S. PATENT DOCUMENTS 5,708,571 A    1/1998  Shinada
2011/0075464 A1   3/2011  Sato

FOREIGN PATENT DOCUMENTS

| JP | H09084337 A | 3/1997 |
| JP | H09294370 A | 11/1997 |
| JP | 2011072160 A | 4/2011 |
| JP | 2013013051 A | 1/2013 |
| WO | 2012165649 A1 | 12/2012 |

*Primary Examiner* — Douglas M Menz

(57) ABSTRACT

Provided is a semiconductor device including a first MOSFET; a second MOSFET; a first resistor provided between a gate terminal of the first MOSFET and a source terminal of the second MOSFET; a second resistor provided between a source terminal of the first MOSFET and a gate terminal of the second MOSFET; a first diode provided in series with the first resistor between the gate terminal of the first MOSFET and the source terminal of the second MOSFET; and a second diode provided in series with the second resistor between the source terminal of the first MOSFET and the gate terminal of the second MOSFET.

5 Claims, 8 Drawing Sheets

100

SEMICONDUCTOR DEVICE

The contents of the following Japanese patent application(s) are incorporated herein by reference: 2018-124847 filed in JP on Jun. 29, 2018.

BACKGROUND

1. Technical Field

The present invention relates to a semiconductor device.

2. Related Art

A conventional voltage conversion circuit is known in which a MOSFET is used, as shown in Patent Documents 1 to 4, for example.
Patent Document 1: Japanese Patent Application Publication No. 2013-13051
Patent Document 2: Japanese Patent Application Publication No. 2011-72160
Patent Document 3: Japanese Patent Application Publication No. H9-294370
Patent Document 4: Japanese Patent Application Publication No. H9-84337

In the voltage conversion circuit, the gate is preferably protected from overvoltage during use, while measuring the gate-source leakage current of the MOSFET.

SUMMARY

According to a first aspect of the present invention, provided is a semiconductor device comprising a first MOSFET; a second MOSFET; a first resistor provided between a gate terminal of the first MOSFET and a source terminal of the second MOSFET; a second resistor provided between a source terminal of the first MOSFET and a gate terminal of the second MOSFET; a first diode provided in series with the first resistor between the gate terminal of the first MOSFET and the source terminal of the second MOSFET; and a second diode provided in series with the second resistor between the source terminal of the first MOSFET and the gate terminal of the second MOSFET.

The first resistor may be provided closer to the source terminal of the second MOSFET than the first diode is. The second resistor may be provided closer to the source terminal of the first MOSFET than the second diode is.

The first resistor may be provided closer to the gate terminal of the first MOSFET than the first diode is. The second resistor may be provided closer to the gate terminal of the second MOSFET than the second diode is.

The semiconductor device may further comprise a first capacitor connected in parallel with the first resistor, between the gate terminal of the first MOSFET and the source terminal of the second MOSFET; and a second capacitor connected in parallel with the second resistor, between the source terminal of the first MOSFET and the gate terminal of the second MOSFET.

The semiconductor device may further comprise a first capacitor connected in parallel with the first resistor and the first diode, between the gate terminal of the first MOSFET and the source terminal of the second MOSFET; and a second capacitor connected in parallel with the second resistor and the second diode, between the source terminal of the first MOSFET and the gate terminal of the second MOSFET.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
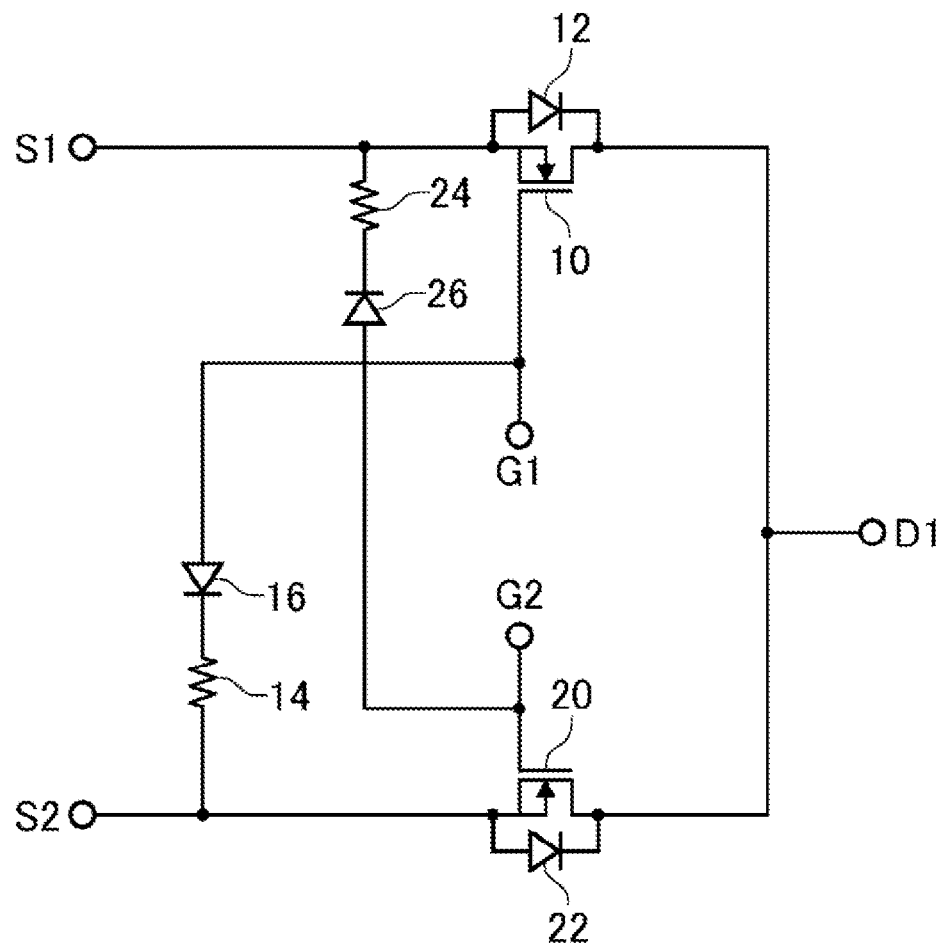
FIG. 1 shows a basic configuration of a semiconductor device 100 according to a first embodiment.

FIG. 1 shows a basic configuration of a semiconductor device 100 according to a first embodiment. The semiconductor device 100 includes a MOSFET 10 and a MOSFET 20.

The semiconductor device 100 is provided to a secondary module of a voltage conversion circuit such as a DC-DC converter. The semiconductor device 100 of the present example is used for common-drain synchronous rectification in the secondary module. For example, the semiconductor device 100 is applied to a full-bridge type of DC-DC converter that uses a phase-shift system.

The MOSFET 10 is provided on a high side of a bridge circuit. The MOSFET 10 is an example of a first MOSFET. The characteristics of the MOSFET 10 may be suitably changed according to the voltage conversion circuit being used, and are not particularly limited.

As shown in the drawings, a body diode 12 is formed in the MOSFET 10 as a parasitic diode. The body diode 12 causes current recirculation to protect the MOSFET 10, by being provided antiparallel to the transistor in the MOSFET 10.

The pull down resistor 14 is provided between the gate terminal G1 of the MOSFET 10 and the source terminal S2 of the MOSFET 20. A pull down resistor 14 stops the breakdown of the MOSFET 10 caused by excessive gate voltage when the gate terminal G1 is open. The pull down resistor 14 is an example of a first resistor.

A clamp diode 16 is provided between the gate terminal G1 of the MOSFET 10 and the source terminal S2 of the MOSFET 20. Specifically, the clamp diode 16 is provided in series with the pull down resistor 14. The clamp diode 16 includes an anode and a cathode. The anode of the clamp diode 16 is provided on the side of the gate terminal G1 the MOSFET 10, and the cathode of the clamp diode 16 is provided on the side of the source terminal S2 the MOSFET 20. The pull down resistor 14 is provided closer to the source terminal S2 of the MOSFET 20 than the clamp diode 16 is. In other words, the clamp diode 16 is provided closer to the gate terminal G1 than the pull down resistor 14 is. It should be noted that the order of the pull down resistor 14 and the clamp diode 16 is not limited to the present example.

The MOSFET 20 is provided on the low side of the bridge circuit. The MOSFET 20 is an example of a second MOSFET. The characteristics of the MOSFET 20 may be suitably changed according to the voltage conversion circuit being used, and are not particularly limited. The MOSFET 20 may have the same configuration as the MOSFET 10. The MOSFET 10 and the MOSFET 20 are connected to a common drain terminal D1.

The body diode 22 causes current recirculation to protect the MOSFET 20, by being provided antiparallel to the transistor in the MOSFET 20.

A pull down resistor 24 is provided between the source terminal S1 of the MOSFET 10 and the gate terminal G2 of the MOSFET 20. The pull down resistor 24 prevents breakdown of the MOSFET 20 caused by excessive gate current when the gate terminal G2 is open. The pull down resistor 24 is an example of a second resistor.

A clamp diode 26 is provided between the source terminal S1 of the MOSFET 10 and the gate terminal G2 of the MOSFET 20. Specifically, the clamp diode 26 is provided in series with the pull down resistor 24. The clamp diode 26 includes an anode and a cathode. The anode of the clamp diode 26 is provided on the side of the gate terminal G2 of the MOSFET 20, and the cathode of the clamp diode 26 is provided on the side of the source terminal S1 of the MOSFET 10. The pull down resistor 24 is provided on the side of the source terminal S1 of the MOSFET 10. In other words, the clamp diode 26 is provided on the gate terminal G2 side of the pull down resistor 24. However, the order of the pull down resistor 24 and the clamp diode 26 is not limited to the present example.

Figure 2:
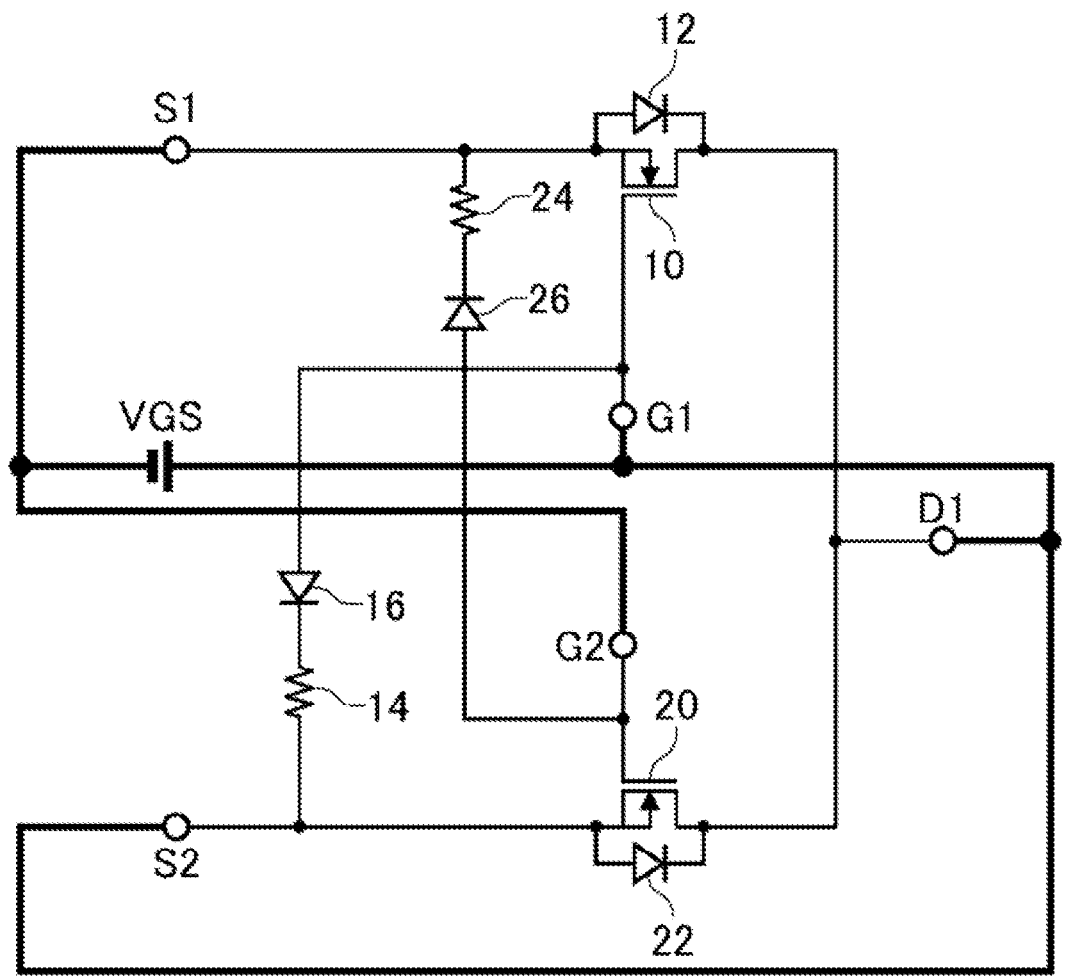
FIG. 2 shows an example of a method for connecting the semiconductor device 100 during a pre-shipment test.

FIG. 2 shows an example of a method for connecting the semiconductor device 100 during a pre-shipment test. In the present example, the MOSFET 10 is tested by applying a voltage between the gate terminal G1 and the source terminal S1. When testing the MOSFET 20, a voltage is applied between the gate terminal G2 and the source terminal S2, in the same manner as when testing the MOSFET 10.

A power supply VGS is connected between the gate terminal G1 and the source terminal S2. The high voltage side is connected to the gate terminal G1, and the low voltage side is connected to the source terminal S1. In this way, it is possible to measure the gate-source leakage current of the MOSFET 10.

The source terminal S2 is connected to the high voltage side of the power supply VGS. Specifically, as a result of connecting both the gate terminal G1 and the source terminal S2 to the high voltage side of the power supply VGS, current does not flow through the pull down resistor 14 and the clamp diode 16 during testing.

A drain terminal D1 is connected to the high voltage side of the power supply VGS. Specifically, as a result of connecting the both the source terminal S2 and the drain terminal D1 to the high voltage side of the power supply VGS, current does not flow through the MOSFET 20 during testing.

The gate terminal G2 is connected to the low voltage side of the power supply VGS. Specifically, as a result of connecting both the gate terminal G2 and the source terminal S1 to the low voltage side of the power supply VGS, current does not flow through the pull down resistor 24 and the clamp diode 26 during testing.

The resistance values of the pull down resistors and magnitude of the applied voltages are not particularly limited. As an example, the resistance values of the pull down resistor 14 and the pull down resistor 24 may each be 5 kΩ, and VGS may be 20 V. The drain-source leak current of the MOSFET can be less than or equal to 1 µA. The semiconductor device 100 can measure a leak current that is less than or equal to 1 µA.

Figure 3:
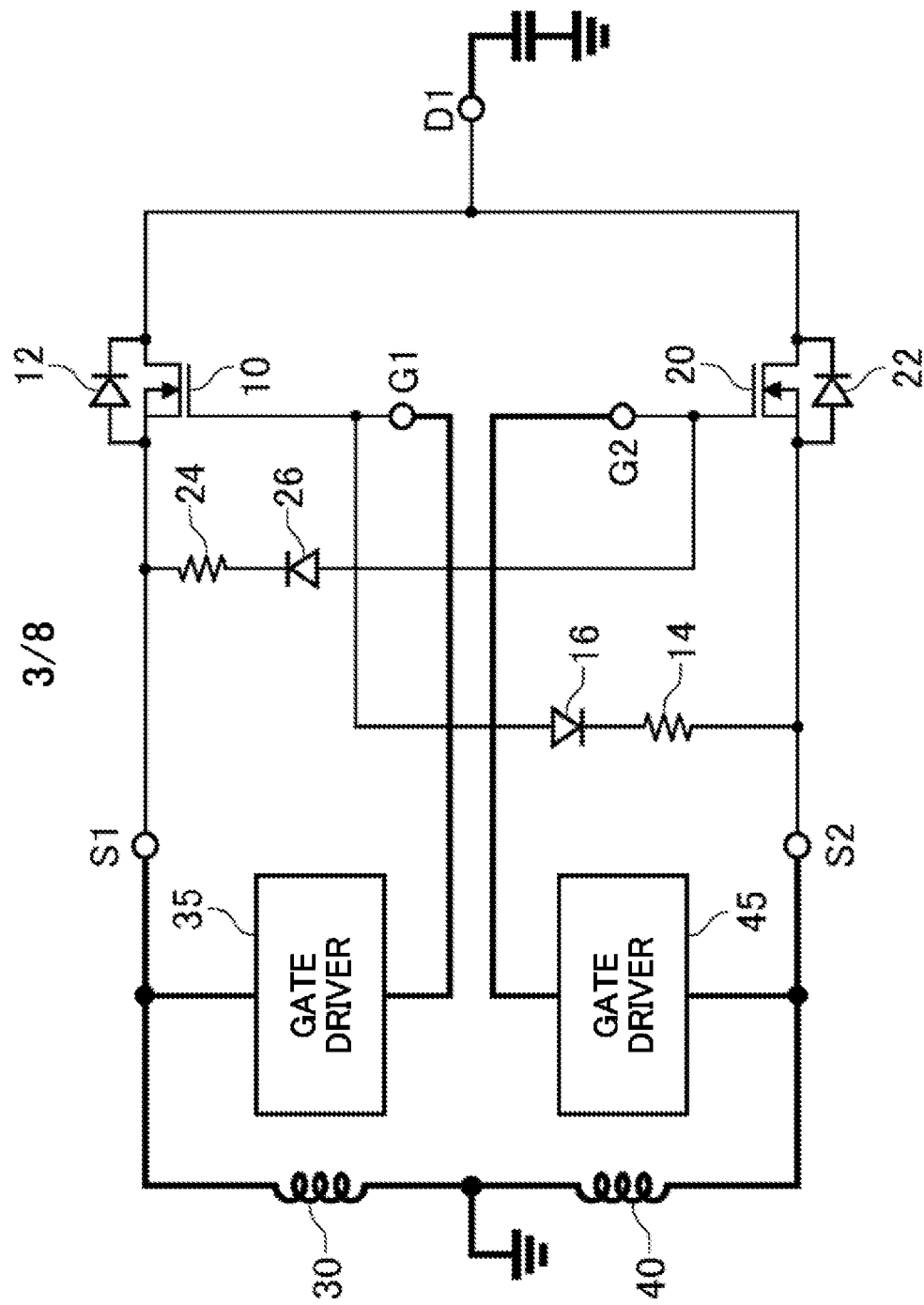
FIG. 3 shows an example of a method for connecting the semiconductor device 100 during use by a user.

FIG. 3 shows an example of a method for connecting the semiconductor device 100 during use by a user. The semiconductor device 100 is connected to each of a first coil 30, a first gate driver 35, a second coil 40, and a second gate driver 45.

The first coil 30 is connected to the high side of the bridge circuit. One end of the first coil 30 is connected to the source terminal S1. The other end of the first coil 30 is connected to the second coil 40. The first coil 30 is a coil for secondary wiring of the DC-DC converter.

The second coil 40 is connected to the low side of the bridge circuit. One end of the second coil 40 is connected to the source terminal S2. The other end of the second coil 40 is connected to the first coil 30. The second coil 40 is a coil for secondary wiring of the DC-DC converter.

The first gate driver 35 controls driving of the MOSFET 10. One end of the first gate driver 35 is connected to the first coil 30 and the source terminal S1. The other end of the first gate driver 35 is connected to the gate terminal G1.

The second gate driver 45 controls driving of the MOSFET 20. One end of the second gate driver 45 is connected to the second coil 40 and the source terminal S2. The other end of the second gate driver 45 is connected to the gate terminal G2.

In the semiconductor device 100, the gate terminal G1 of the MOSFET 10 is connected to the second coil 40, the first coil 30, and the source terminal S1 via the pull down resistor 14 and the clamp diode 16. In this way, the gate voltage of the MOSFET 10 is fixed. Accordingly, even when the gate terminal G1 is detached and opened, the semiconductor device 100 can restrict excessive gate voltage of the MOSFET 10.

Similarly, in the semiconductor device 100, the gate terminal G2 of the MOSFET 20 is connected to the first coil 30, the second coil 40, and the source terminal S2 via the pull down resistor 24 and the clamp diode 26. In this way, the gate voltage of the MOSFET 20 is fixed. Accordingly, even when the gate terminal G2 is detached and opened, the semiconductor device 100 can restrict excessive gate voltage of the MOSFET 20.

Figure 4A:
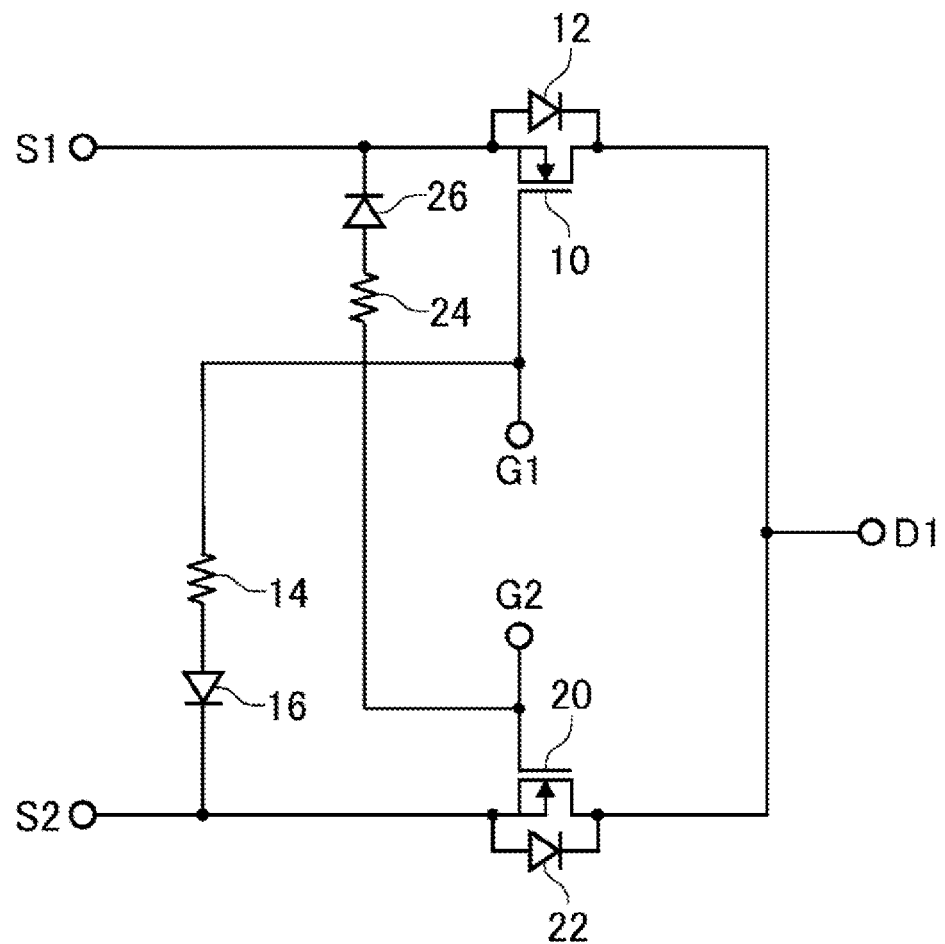
FIG. 4A shows an example of a semiconductor device 100 according to the second embodiment.

FIG. 4A shows an example of a semiconductor device 100 according to the second embodiment. The semiconductor device 100 of the present example differs from that of the first embodiment with regard to the order of the pull down resistors and the clamp diodes. In the present example, the description focuses on the points differing from the first embodiment. In the semiconductor device 100 of the second embodiment as well, the methods for connection during use and during testing are the same as in the first embodiment.

The pull down resistor 14 is provided in series with the clamp diode 16 between the gate terminal G1 of the MOSFET 10 and the source terminal S2 of the MOSFET 20. It should be noted that the pull down resistor 14 of the present example is provided on the gate terminal G1 side of the clamp diode 16.

The pull down resistor 24 is provided in series with the clamp diode 26 between the source terminal S1 of the MOSFET 10 and the gate terminal G2 of the MOSFET 20. It should be noted that the pull down resistor 24 of the present example is provided on the gate terminal G2 side of the clamp diode 26.

In the semiconductor device 100 of the present example, the order of the pull down resistors and the clamp diodes differs from the order shown in the first embodiment, but it is still possible to easily measure the leak at the gate-source junctions of the MOSFETs during pre-shipment testing, in the same manner as in the semiconductor device 100 of the first embodiment. Furthermore, the semiconductor device 100 can protect the MOSFET 10 and the MOSFET 20 even when the gate terminal G1 or the gate terminal G2 is detached during use on the user side.

Figure 4B:
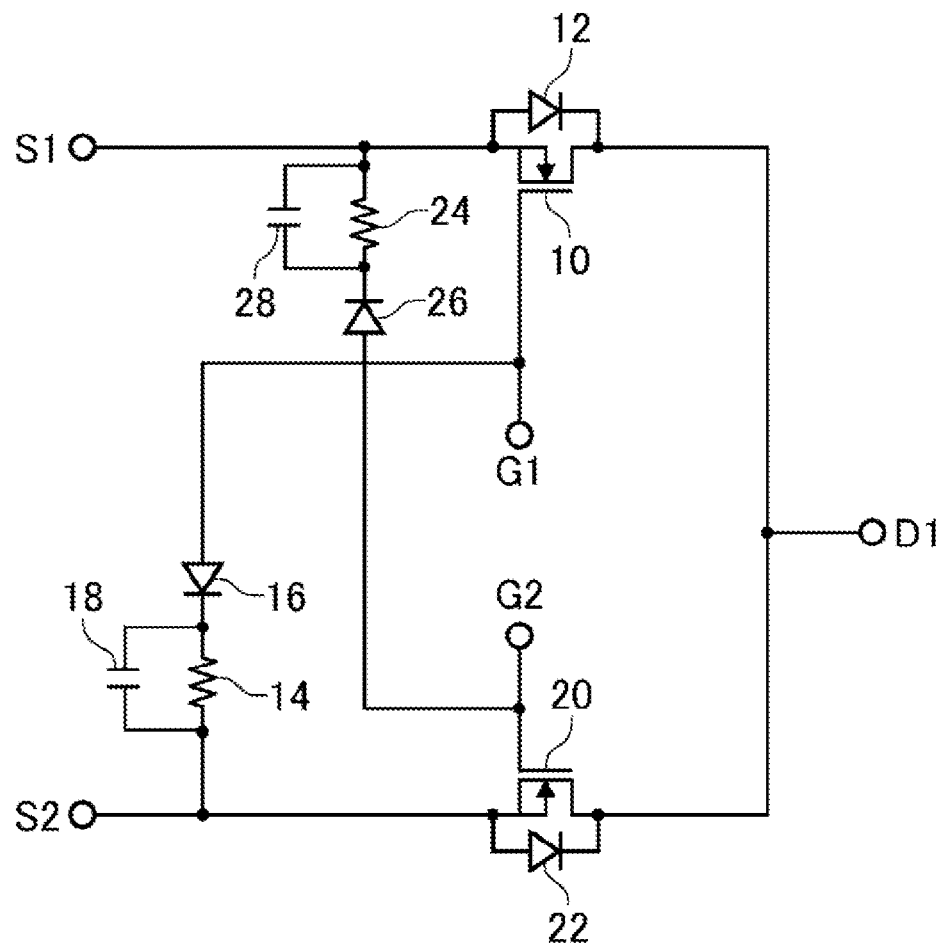
FIG. 4B shows an example of a semiconductor device 100 according to the third embodiment.

FIG. 4B shows an example of a configuration of a semiconductor device 100 according to the third embodiment. The semiconductor device 100 of the present example differs from the semiconductor device 100 according to the first and second embodiments by including a capacitor 18 and a capacitor 28. In the present example, the description focuses on differences with respect to the first and second embodiments.

The capacitor 18 is provided between the gate terminal G1 of the MOSFET 10 and the source terminal S2 of the MOSFET 20. The capacitor 18 is restricts oscillation of the gate of the MOSFET 10. The capacitor 18 is provided in parallel with the pull down resistor 14. The capacitor 18 is one example of a first capacitor.

The capacitor 28 is provided between the source terminal S1 of the MOSFET 10 and the gate terminal G2 of the MOSFET 20. The capacitor 28 is restricts oscillation of the gate of the MOSFET 20. The capacitor 28 is provided in parallel with the pull down resistor 24. The capacitor 28 is one example of a second capacitor.

Figure 4C:
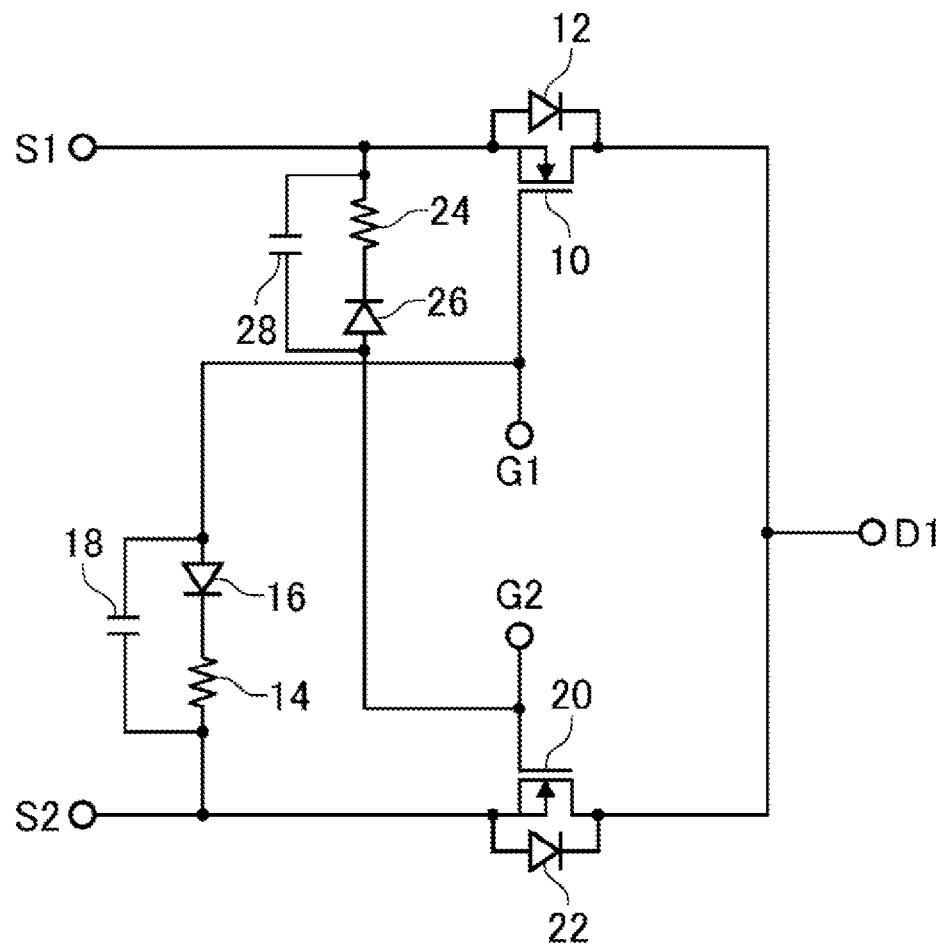
FIG. 4C shows an example of a semiconductor device 100 according to the fourth embodiment.

FIG. 4C shows an example of a configuration of a semiconductor device 100 according to the fourth embodiment. The semiconductor device 100 of the present example differs from the semiconductor device 100 according to the third example with regard to the position where the capacitor 18 and the capacitor 28 are provided. In the present example, the description focuses on points differing from the third embodiment.

The capacitor 18 is provided between the gate terminal G1 of the MOSFET 10 and the source terminal S2 of the MOSFET 20. The capacitor 18 is provided in parallel with the pull down resistor 14 and the clamp diode 16. The capacitor 18 is one example of a first capacitor. The order of the pull down resistor 14 and the clamp diode 16 between the gate terminal G1 of the MOSFET 10 and the source terminal S2 of the MOSFET 20 may be switched.

The capacitor 28 is provided between the source terminal S1 of the MOSFET 10 and the gate terminal G2 of the MOSFET 20. The capacitor 28 is provided in parallel with the pull down resistor 24 and the clamp diode 26. The capacitor 28 is one example of a second capacitor. The order of the pull down resistor 24 and the clamp diode 26 between the source terminal S1 of the MOSFET 10 and the gate terminal G2 of the MOSFET 20 may be switched.

The semiconductor device 100 of the present example restricts the oscillation of the gate of the MOSFET 10, by having the capacitor 18 provided between the gate terminal G1 of the MOSFET 10 and the source terminal S2 of the MOSFET 20. Furthermore, the semiconductor device 100 restricts the oscillation of the gate of the MOSFET 20, by having the capacitor 28 provided between the source terminal S1 of the MOSFET 10 and the gate terminal G2 of the MOSFET 20.

Figure 5A:
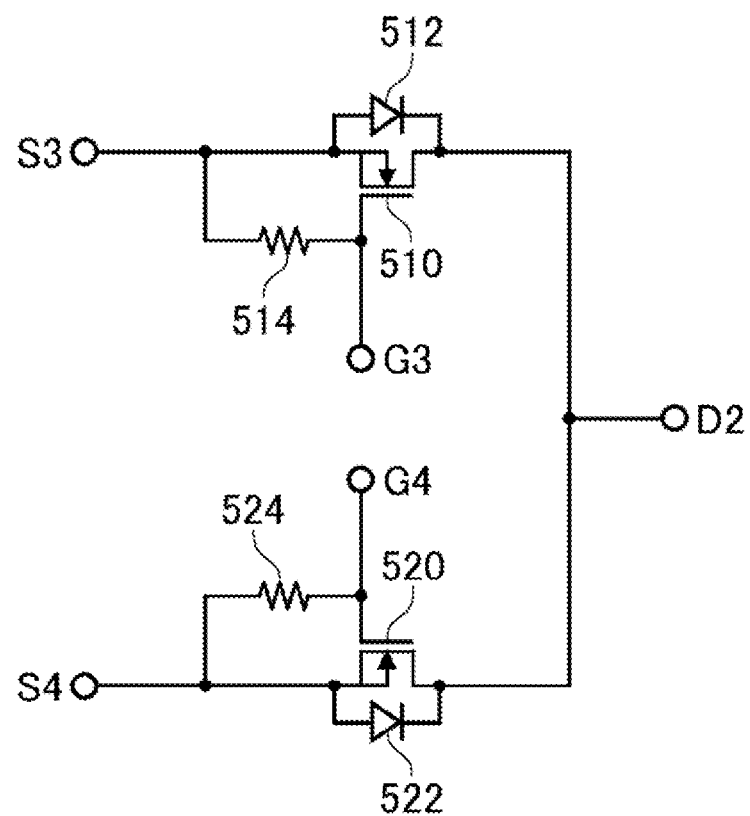
FIG. 5A shows an example of the configuration of a semiconductor device 500 according to a comparative example.

FIG. 5A shows an example of the configuration of a semiconductor device 500 according to a comparative example. The semiconductor device 500 of the present example includes a MOSFET 510 and a MOSFET 520. The MOSFET 510 and the MOSFET 520 are connected to a common drain terminal D2.

The MOSFET 510 is provided on the high side of the bridge circuit. A body diode 512 is formed antiparallel to the transistor in the MOSFET 510. A pull down resistor 514 is provided between the gate terminal G3 of the MOSFET 510 and the source terminal S3 of the MOSFET 510.

The MOSFET 520 is provided on the low side of the bridge circuit. A body diode 522 is formed antiparallel to the transistor in the MOSFET 520. A pull down resistor 524 is provided between the gate terminal G4 of the MOSFET 520 and the source terminal S4 of the MOSFET 520.

Figure 5B:
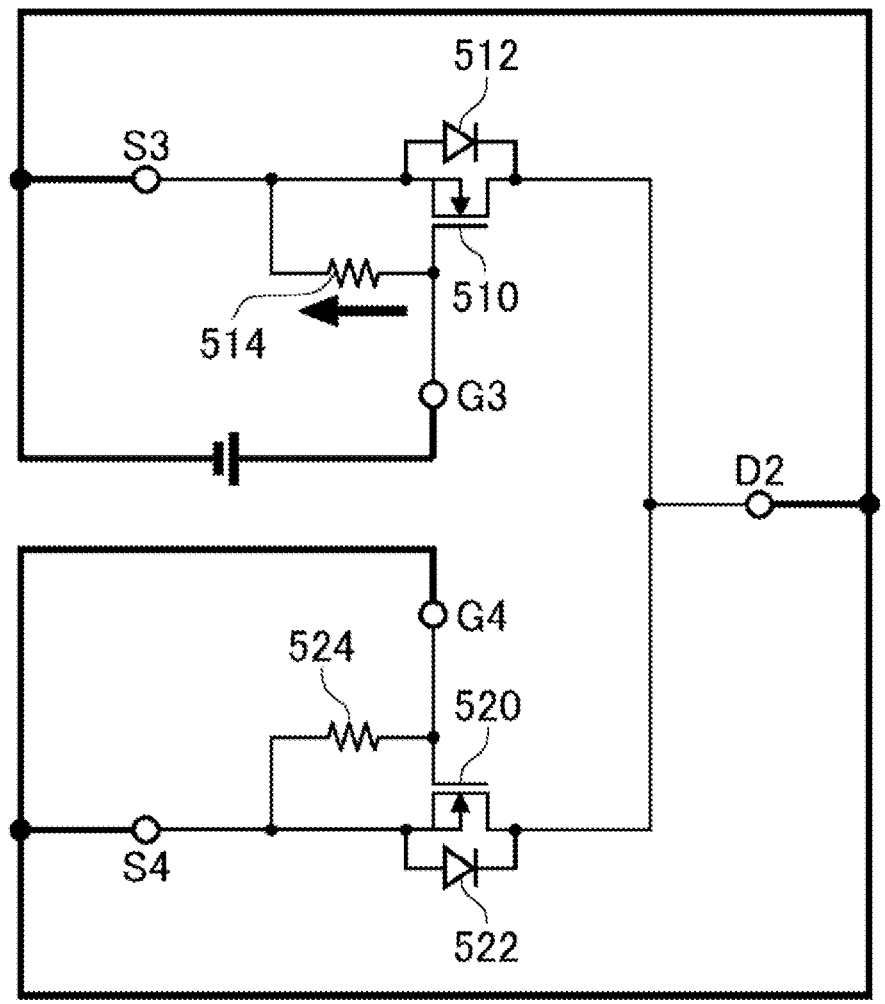
FIG. 5B shows an example of a method for connecting the semiconductor device 500 during pre-shipment testing.

FIG. 5B shows an example of a method for connecting the semiconductor device 500 during pre-shipment testing. In the present example, the MOSFET 510 is tested by applying a voltage between the gate terminal G3 and the source terminal S3.

The power supply VGS is connected between the gate terminal G3 and the source terminal S3. In this way, it is possible to measure the leak current at the gate-source junction of the MOSFET 510. The pull down resistor 514 and the pull down resistor 524 are provided to stop breakdown of the MOSFET 510 and the MOSFET 520 due to excessive gate voltage when the gate terminals are open.

The pull down resistor 514 has a lower resistance than the gate-source resistance of the MOSFET 510, and therefore the current flowing through the pull down resistor 514 is dominant when a voltage is applied at the gate-source junction. Therefore, it is not easy to measure the leak current at the gate-source junction of the MOSFET 510. The same is true for the measurement of the leak current at the gate-source junction of the MOSFET 520.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
a first MOSFET;
a second MOSFET;
a first resistor provided between a gate terminal of the first MOSFET and a source terminal of the second MOSFET;
a second resistor provided between a source terminal of the first MOSFET and a gate terminal of the second MOSFET;

a first diode provided in series with the first resistor between the gate terminal of the first MOSFET and the source terminal of the second MOSFET; and a second diode provided in series with the second resistor between the source terminal of the first MOSFET and the gate terminal of the second MOSFET.

2. The semiconductor device according to claim 1, wherein the first resistor is provided closer to the source terminal of the second MOSFET than the first diode is, and the second resistor is provided closer to the source terminal of the first MOSFET than the second diode is.

3. The semiconductor device according to claim 1, wherein the first resistor is provided closer to the gate terminal of the first MOSFET than the first diode is, and the second resistor is provided closer to the gate terminal of the second MOSFET than the second diode is.

4. The semiconductor device according to claim 1, further comprising:

a first capacitor connected in parallel with the first resistor, between the gate terminal of the first MOSFET and the source terminal of the second MOSFET; and a second capacitor connected in parallel with the second resistor, between the source terminal of the first MOSFET and the gate terminal of the second MOSFET.

5. The semiconductor device according to claim 1, further comprising:

a first capacitor connected in parallel with the first resistor and the first diode, between the gate terminal of the first MOSFET and the source terminal of the second MOSFET; and a second capacitor connected in parallel with the second resistor and the second diode, between the source terminal of the first MOSFET and the gate terminal of the second MOSFET.

\* \* \* \* \*